(12) United States Patent
Theuss

(10) Patent No.: US 7,569,427 B2
(45) Date of Patent: Aug. 4, 2009

(54) SEMICONDUCTOR COMPONENT WITH CONNECTING ELEMENTS AND METHOD FOR PRODUCING THE SAME

(75) Inventor: Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 11/558,213

(22) Filed: Nov. 9, 2006

(65) Prior Publication Data

US 2007/0273046 A1    Nov. 29, 2007

(30) Foreign Application Priority Data

Nov. 9, 2005    (DE) .................. 10 2005 053 842

(51) Int. Cl.
    *H01L 21/00* (2006.01)
(52) U.S. Cl. .................. 438/127; 438/124; 438/126; 438/462; 438/464; 438/465; 257/E21.502; 257/E21.503
(58) Field of Classification Search ................ 257/692, 257/678, E23.011, E23.02, E23.035, E23.041, 257/E23.151, E23.175, E21.502, E21.503, 257/E21.599, E21.6; 438/110, 114, 124, 438/126, 127, 462, 464, 465, 458, 459
See application file for complete search history.

(56) References Cited

U.S. PATENT DOCUMENTS

| | | | |
|---|---|---|---|
| 5,656,858 A * | 8/1997 | Kondo et al. ................ | 257/737 |
| 6,187,614 B1 | 2/2001 | Takata et al. | |
| 6,197,613 B1 | 3/2001 | Kung et al. | |
| 6,353,267 B1 * | 3/2002 | Ohuchi et al. ............... | 257/787 |
| 6,392,290 B1 * | 5/2002 | Kasem et al. ............... | 257/678 |
| 6,420,244 B2 * | 7/2002 | Lee ............................. | 438/458 |
| 6,518,097 B1 | 2/2003 | Yim et al. | |
| 6,555,759 B2 * | 4/2003 | Tzanavaras et al. ......... | 174/260 |
| 2001/0018229 A1 | 8/2001 | Kato et al. | |
| 2002/0117762 A1 | 8/2002 | Ikegami | |
| 2004/0161908 A1 | 8/2004 | Terui et al. | |
| 2005/0017374 A1 | 1/2005 | Kiendl et al. | |
| 2006/0151861 A1 * | 7/2006 | Noquil et al. ............... | 257/676 |

FOREIGN PATENT DOCUMENTS

| | | |
|---|---|---|
| DE | 10333841 | 2/2005 |
| DE | 102005040686 | 11/2006 |
| WO | 01/63668 | 8/2001 |

* cited by examiner

*Primary Examiner*—Matthew Smith
*Assistant Examiner*—Julio J Maldonado
(74) *Attorney, Agent, or Firm*—Dicke, Billig, Czaja PLLC

(57) ABSTRACT

A semiconductor component with connecting elements between a semiconductor chip made from a semiconductor wafer with discrete semiconductor components and a superordinate circuit carrier is disclosed. The semiconductor component has a coplanar area having top sides of the connecting elements and a plastic housing composition. The connecting element has a mesa structure or a mushroom-shaped form for surface mounting. Moreover, the connecting element includes a structured nickel- and lead-free contact coating. The connecting element is arranged on contact areas of the semiconductor chip, the areal extent of the connecting elements corresponding to the contact areas of the semiconductor chip.

22 Claims, 10 Drawing Sheets

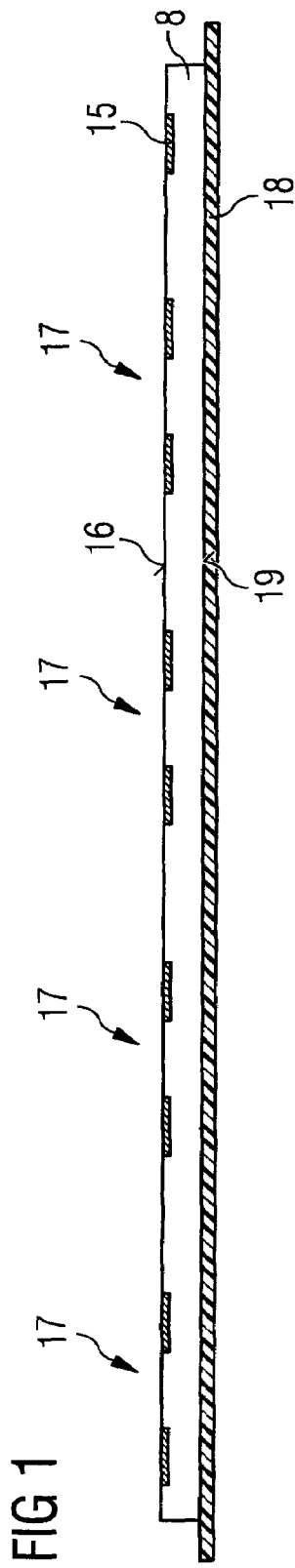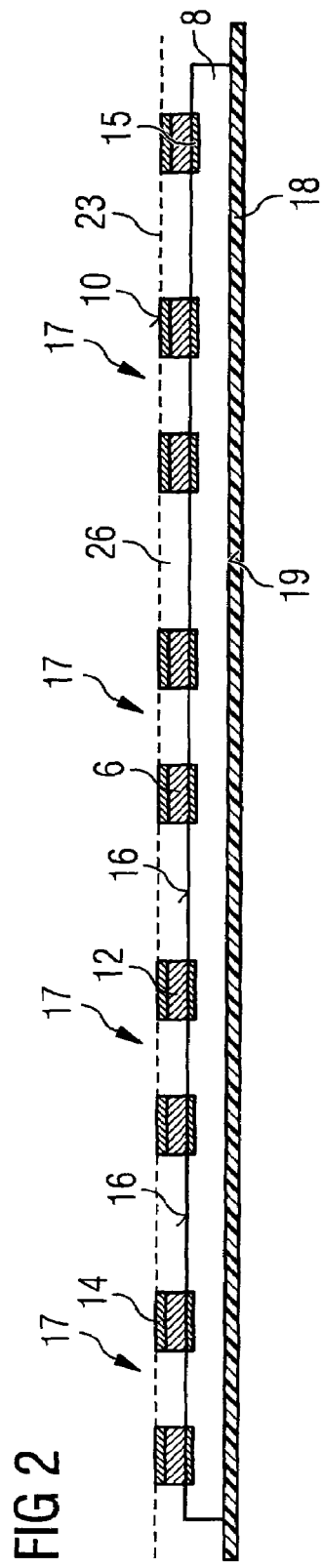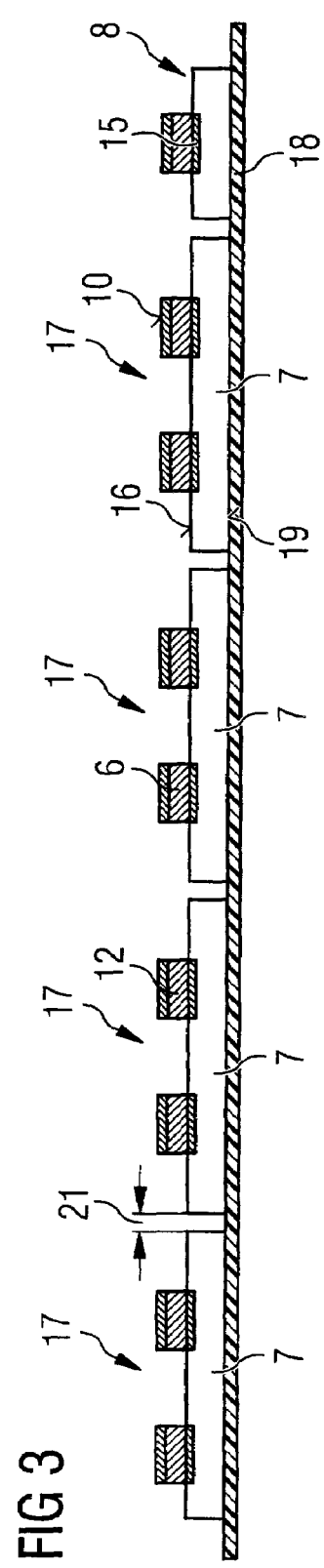

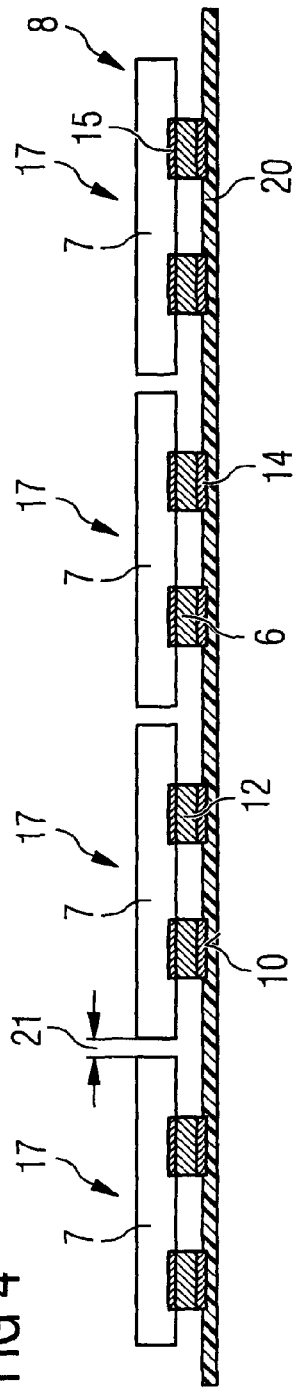
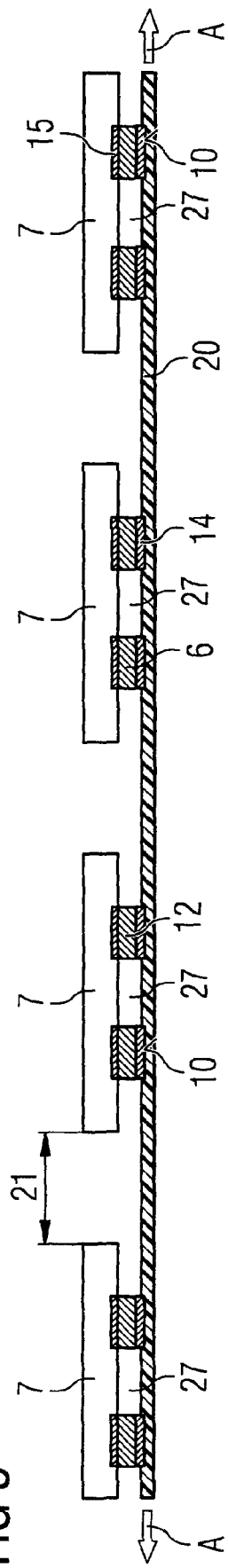

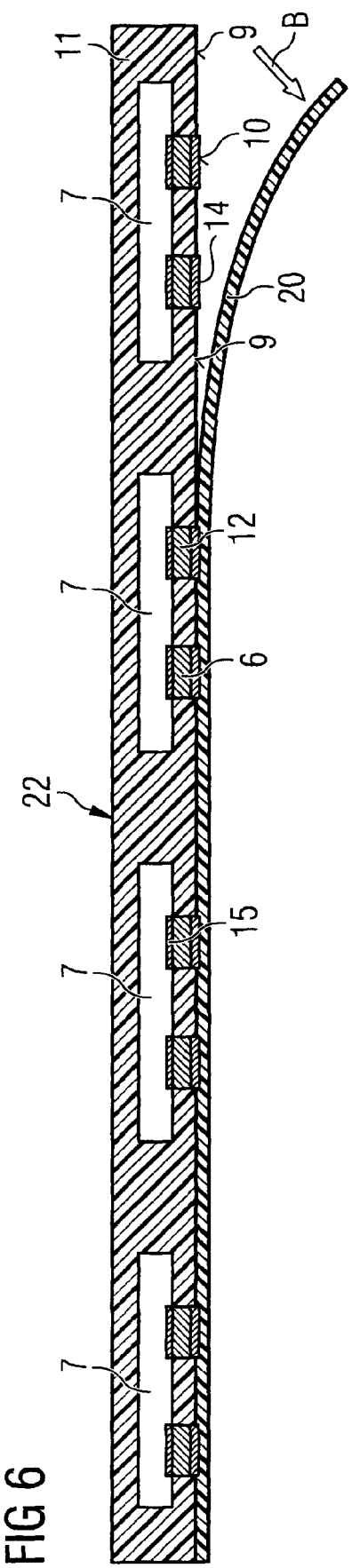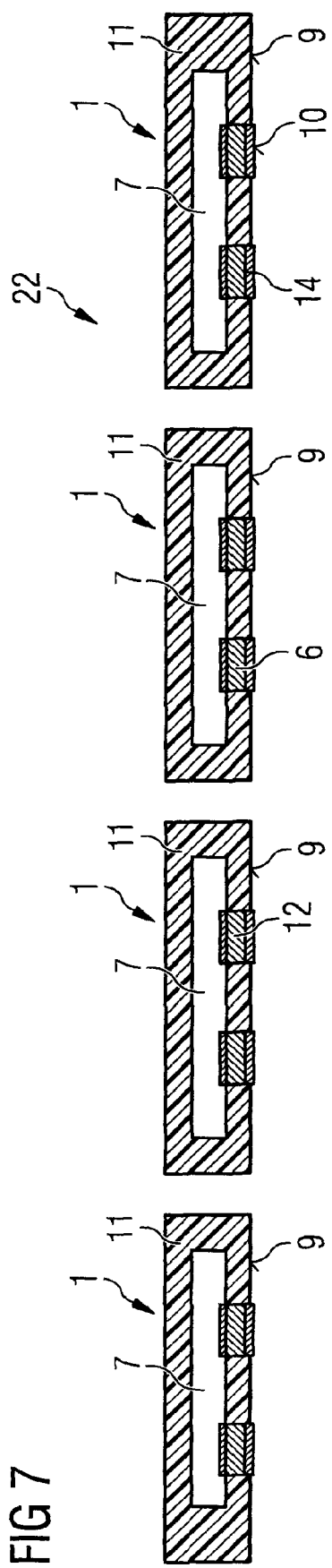

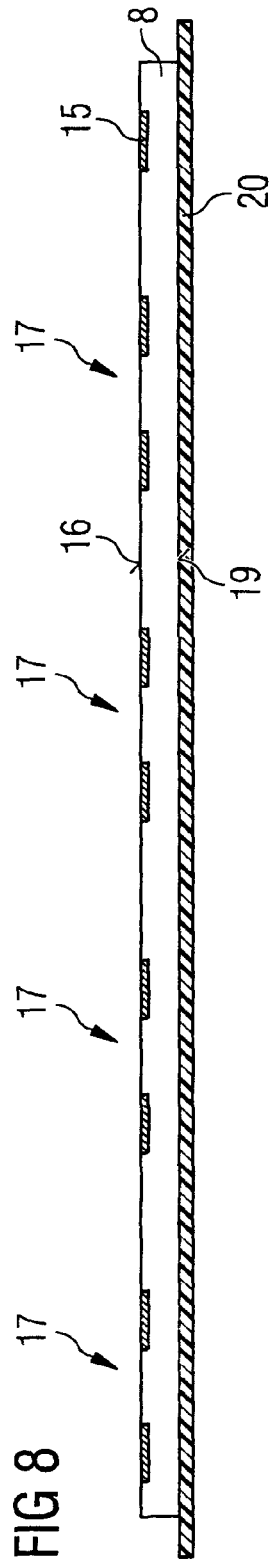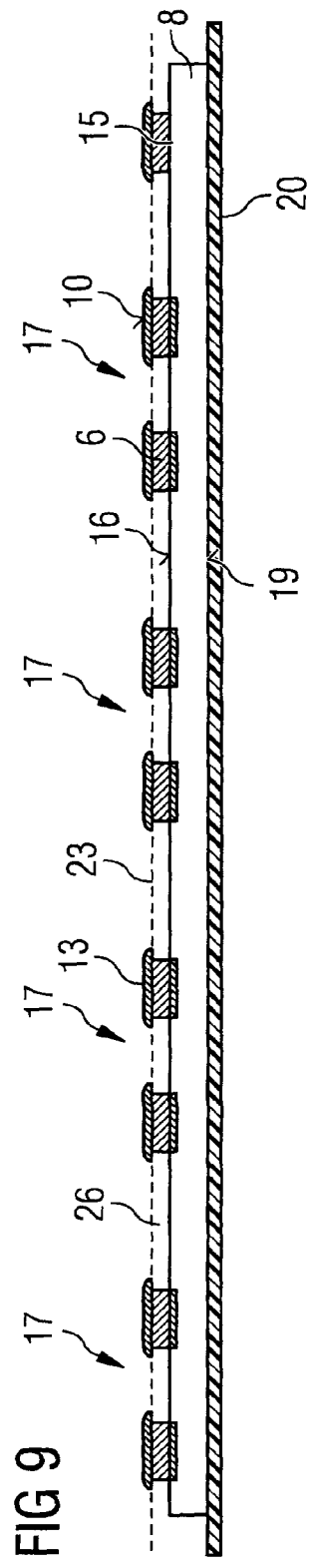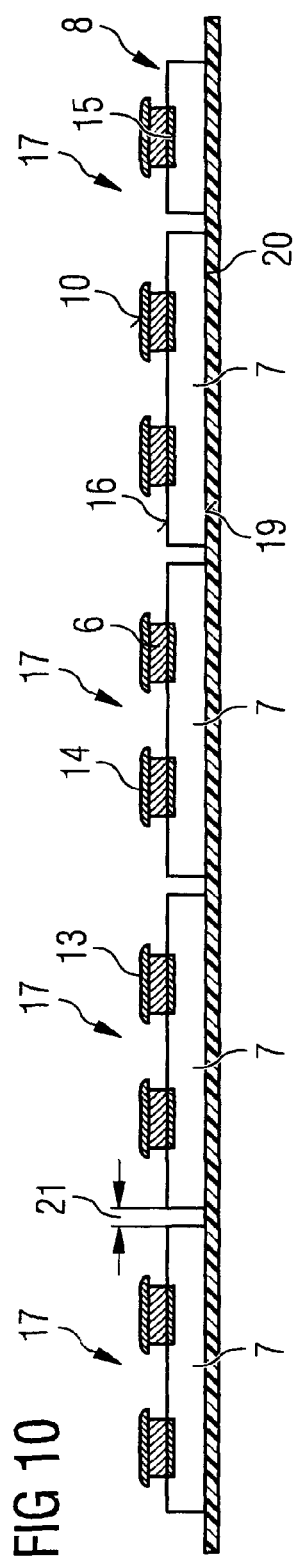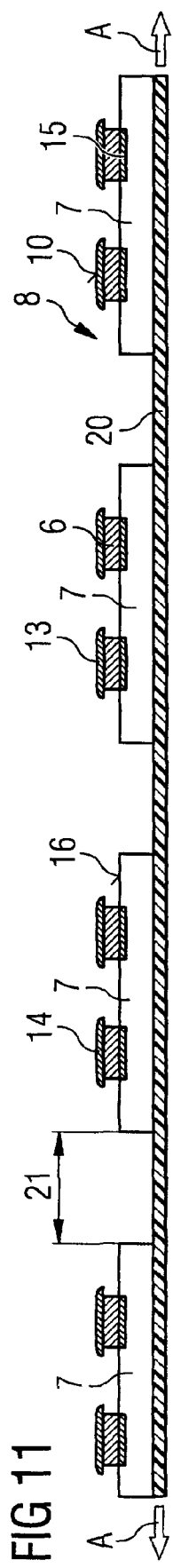

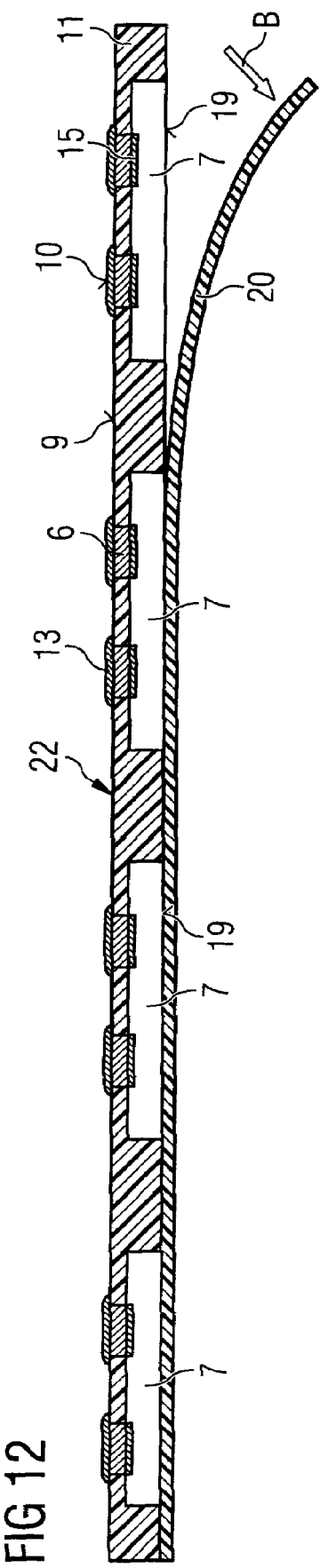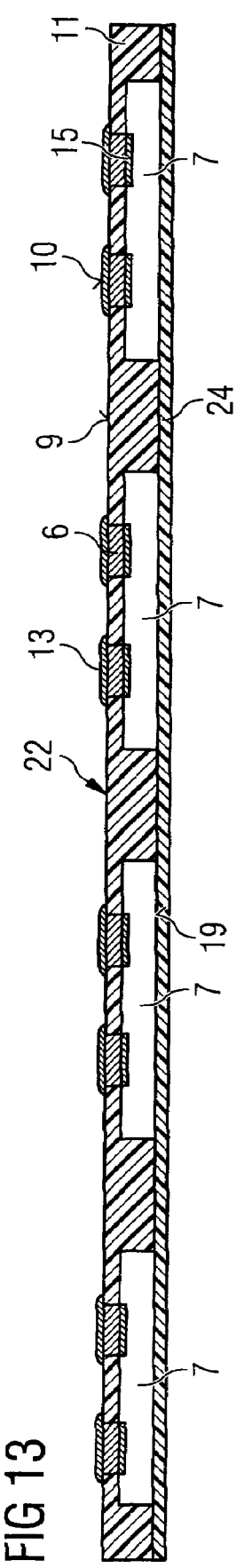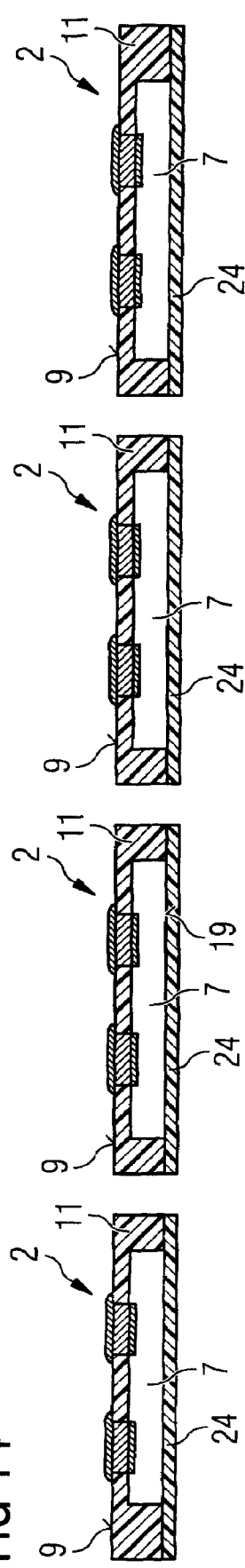

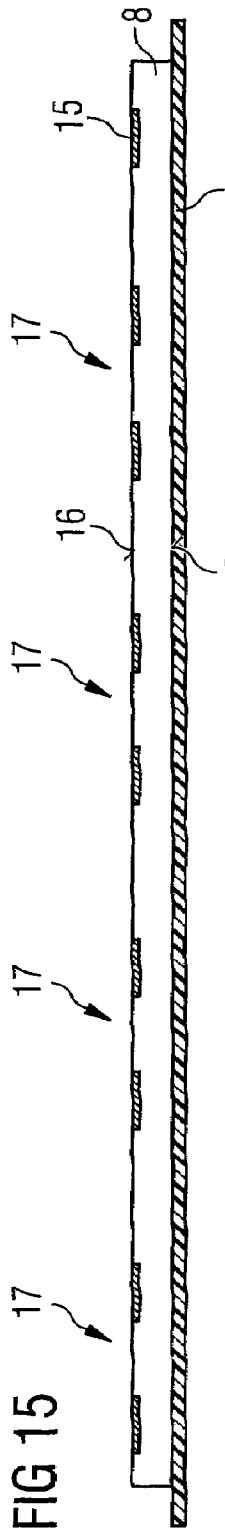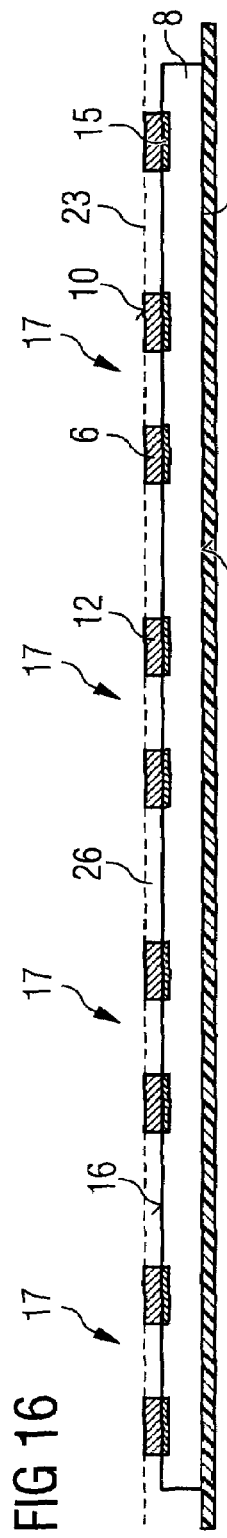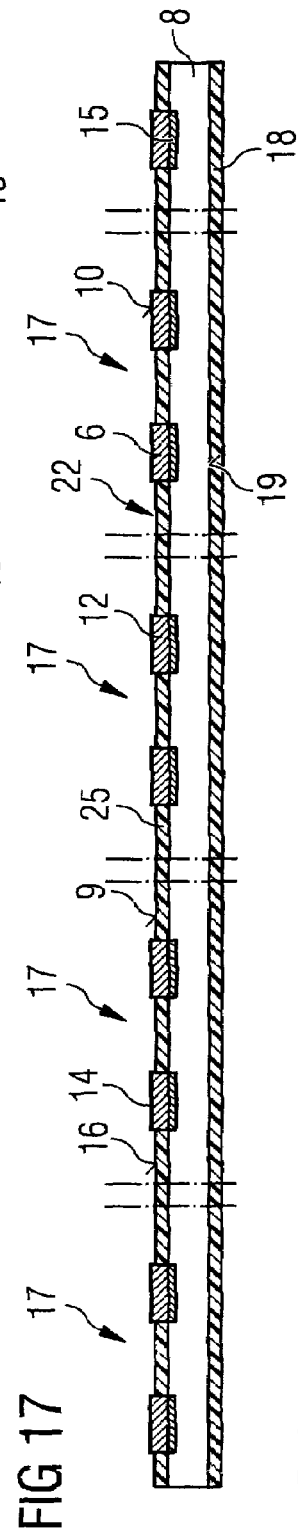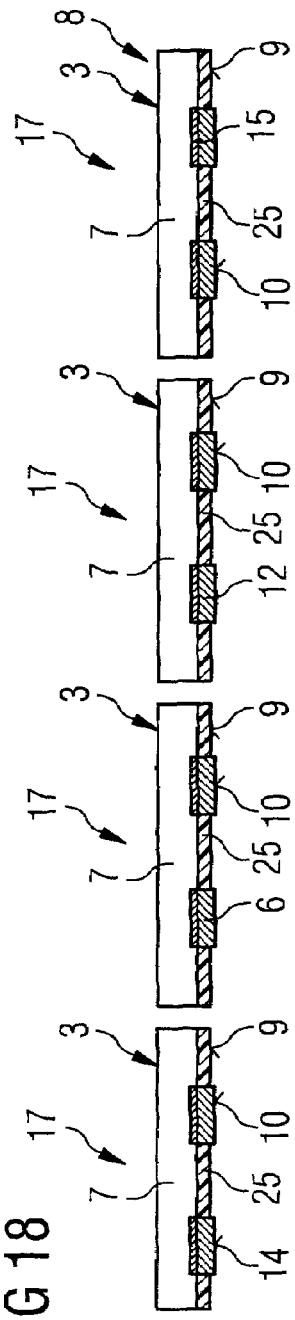

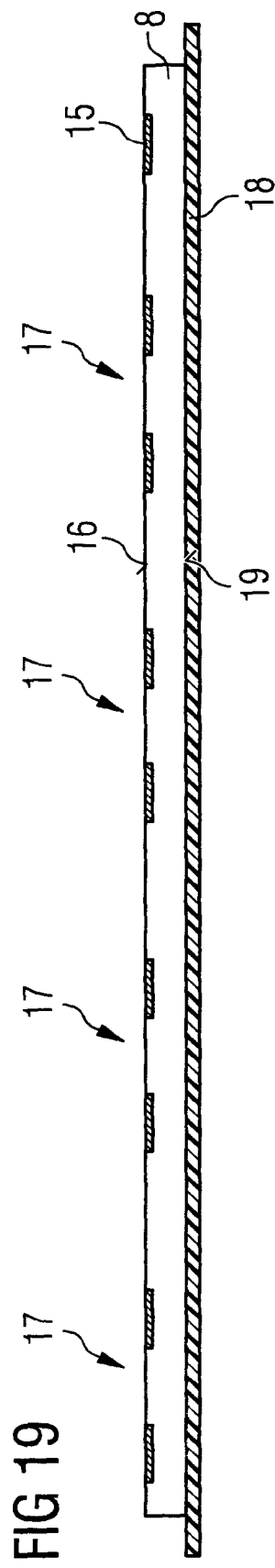
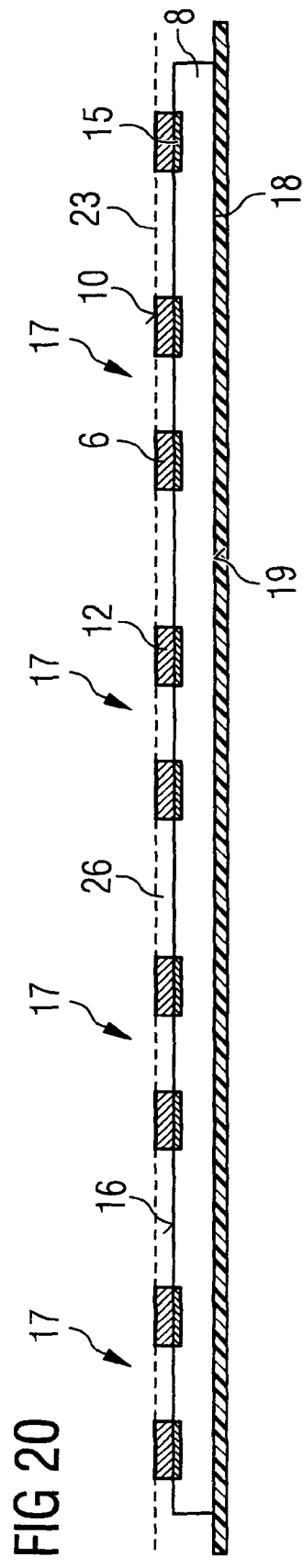
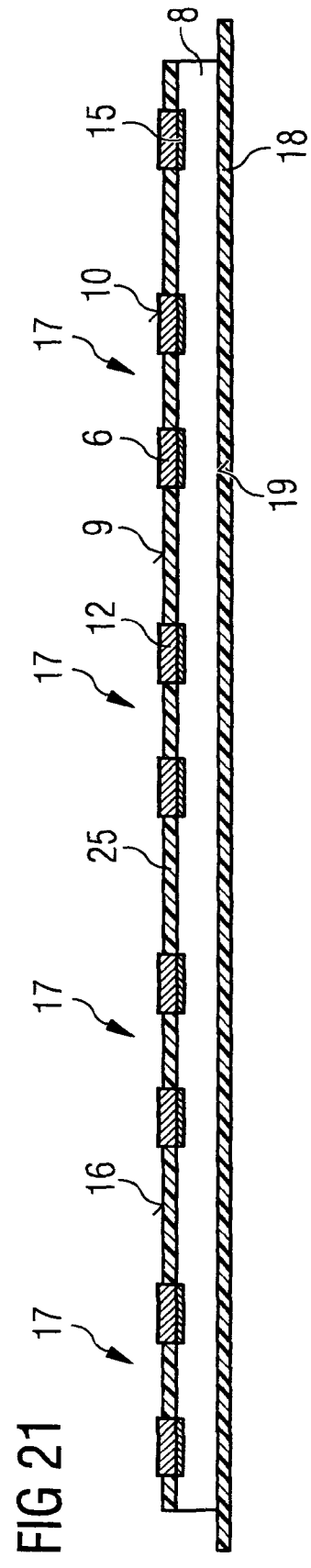

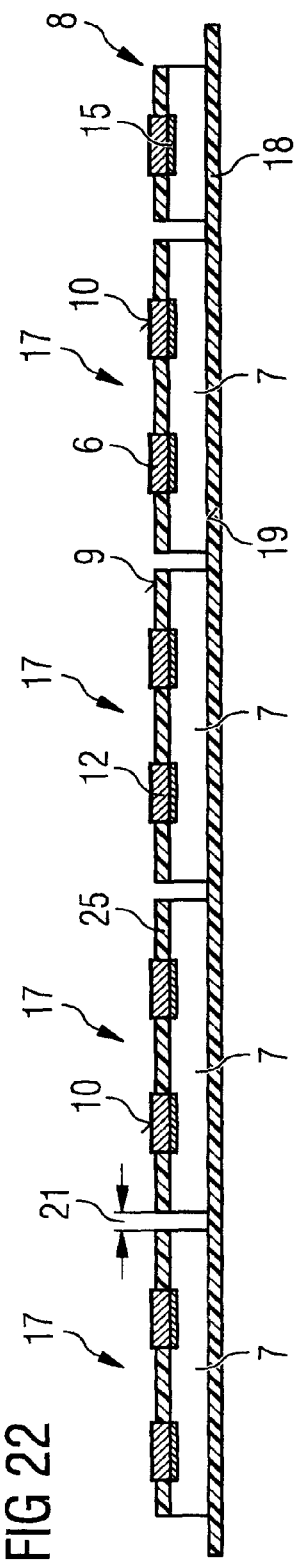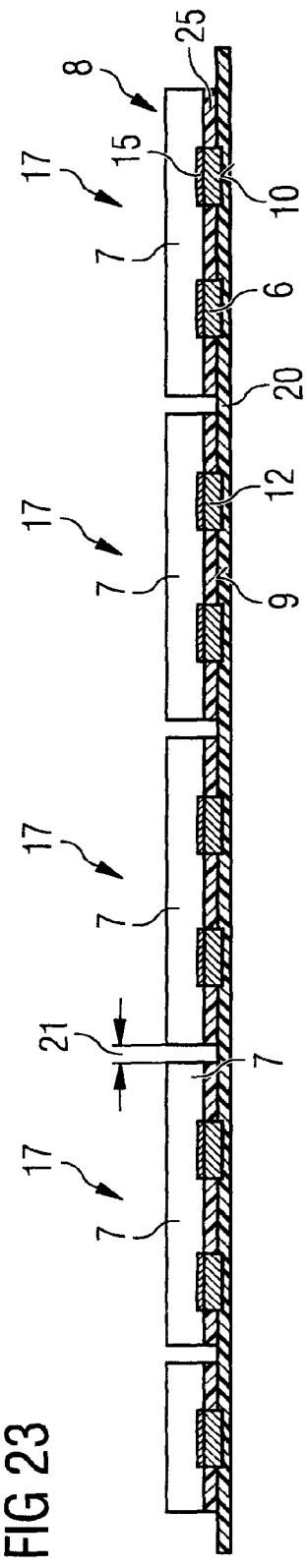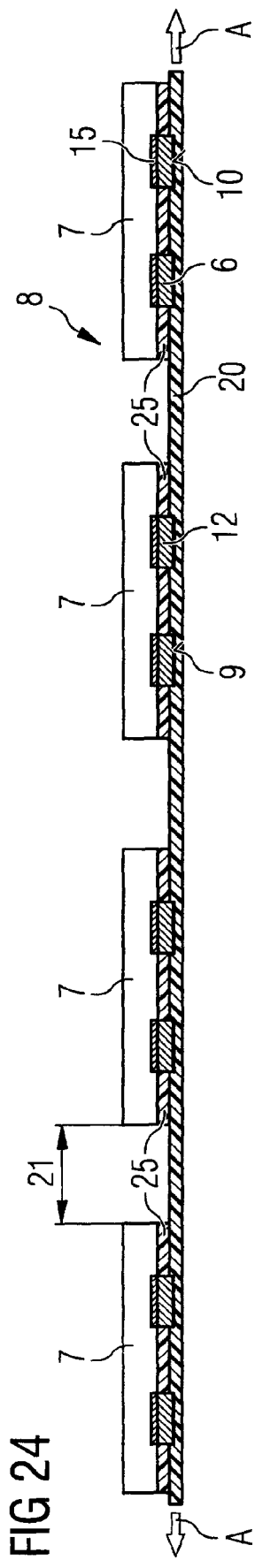

SEMICONDUCTOR COMPONENT WITH CONNECTING ELEMENTS AND METHOD FOR PRODUCING THE SAME

CROSS-REFERENCE TO RELATED APPLICATIONS

This Utility Patent Application claims priority to German Patent Application No. DE 10 2005 053 842.8 filed on Nov. 9, 2005, which is incorporated herein by reference.

BACKGROUND

The invention relates to a semiconductor component with connecting elements and a method for producing the same. The semiconductor component has the connecting elements on a semiconductor chip made from a semiconductor wafer with discrete semiconductor components for surface mounting on a superordinate circuit carrier. In this case, the semiconductor component has a coplanar area having top sides of the connecting elements and a plastics composition. The connecting elements are provided on contact areas of the semiconductor chip or semiconductor component.

The miniaturization of discrete semiconductor components, such as diodes and transistors, and the price pressure on such standardized semiconductor components constantly demand new and revised solutions for the housing construction. The housing construction makes a distinction between housings based on a flat conductor leadframe, such as, for example, SOT, SOD, SC, and/or TSFP housings, and flat-conductor-free housings, such as, for example, the TSLP housing. These current solutions for providing housing constructions for discrete semiconductor components have the disadvantage that they are based on processes such as die bonding and wire bonding. In this case, it is disadvantageous that it is necessary to provide corresponding semiconductor chip pads for the application of the semiconductor chips in the case of die bonding and corresponding contact pads for fitting the bonding wires in the case of wire bonding on a carrier.

These components reduce the possibility of improving the housings with regard to miniaturization. Thus, the housing height cannot be reduced arbitrarily since the thickness of the contact pads or the thickness of the semiconductor chip contact areas and the thickness of the semiconductor chip, and also the bonding wire loop height and the height of the plastic housing composition for embedding the bonding wires have to be taken into account. Limits are imposed on the miniaturization of the lateral dimensions in the case of the discrete semiconductor components since it is necessary to take account of sufficient space for the tolerances of wire bonding on the semiconductor chips, the tolerances of the lengths of the bonding wires and the tolerances for the wall thickness of the moulding compositions. As a result, in the case of discrete semiconductor components, the possibility for miniaturization is exhausted at dimensions of below half a millimeter with regard to length, width and height of the packaged semiconductor component.

In the case of TSLP housings, a final process of electroless chemical deposition of NiAu has hitherto been provided, which may bring about the risk of embrittlement of the surface-mountable external contacts since nickel tends towards the formation of brittle phases and thus constitutes a reliability problem. Under certain circumstances, the known wafer level packaging is also associated with a reliability problem, especially if active surface regions of the semiconductor chips and/or the rear sides thereof are not protected by a plastic housing composition.

In the case of surface-mountable BGA housings, a particular reliability problem is posed by the requirement for wiring substrates and underfill materials which have to compensate for and fill the distance to superordinate circuit carriers in order to reduce thermal stresses, which, furthermore, demands an additional space requirement and expensive production methods.

The document U.S. Pat. No. 6,197,613 B1 discloses a method for forming a housing based on a semiconductor wafer, which involves firstly providing a silicon wafer having a multiplicity of integrated circuit chips formed on the top side of the semiconductor wafer. Each of the integrated circuit chips has I/O contact areas, at least on a top side, which are not arranged in freely accessible fashion but rather in an elastic insulating layer. These contact areas are electrically connected to solder balls as flip-chip contacts via through contacts through the elastic insulating layer and via interconnects on the elastic layer. The semiconductor components of the order of magnitude of semiconductor chips that are produced by this method have the disadvantage that their housing height cannot be reduced arbitrarily due to the solder ball and the elastic layer arranged underneath.

The document U.S. Pat. No. 6,518,097 B1 discloses a method for producing flip-chip housings based on a semiconductor wafer using an anisotropically conductive adhesive. For this purpose, a bonding hump free of solder material, such as a bonding hump made of gold or a nickel/gold bonding hump deposited in electroless fashion, is produced on the contact areas of each semiconductor chip of a semiconductor wafer. An anisotropically conductive adhesive solution or a film is arranged on the wafer, and the semiconductor wafer is subsequently separated into individual semiconductor chips.

Each of the semiconductor chips is mechanically or electrically connected to a substrate by means of the anisotropically conductive adhesive. This method has the disadvantage that the semiconductor chips cannot be connected to a substrate in a solderable manner, rather the anisotropically conductive adhesive or an anisotropically conductive film is required for this purpose, which restricts both the method costs and the usability of such a semiconductor component for discrete semiconductor components.

For these and other reasons, there is a need for the present invention.

SUMMARY

One embodiment of the invention provides a semiconductor component with connecting elements between a semiconductor chip made from a semiconductor wafer with discrete semiconductor components and a superordinate circuit carrier. The semiconductor component has a coplanar area having top sides of the connecting elements and a plastic housing composition. The connecting element has a mesa structure or a mushroom-shaped form for surface mounting. Moreover, the connecting element includes a structured nickel- and lead-free contact coating. The connecting element is arranged on contact areas of the semiconductor chip, the areal extent of the connecting elements corresponding to the contact areas of the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through a semiconductor wafer with semiconductor chip structures in semiconductor chip positions on a separation film.

FIG. 2 illustrates a schematic cross section through the semiconductor wafer of FIG. 1 after the application of mesa-type connecting elements.

FIG. 3 illustrates a schematic cross section through the semiconductor wafer of FIG. 2 after the separation of the semiconductor wafer into individual semiconductor chips.

FIG. 4 illustrates a schematic cross section through the separated semiconductor wafer in accordance with FIG. 3 after application to an expandable packaging film.

FIG. 5 illustrates a schematic cross section through the separated semiconductor wafer in accordance with FIG. 4 after the expansion of the packaging film.

FIG. 6 illustrates a schematic cross section through a composite plate after the embedding of the semiconductor chips into a plastics composition.

FIG. 7 illustrates a schematic cross section through the composite plate after separation into individual semiconductor components.

FIG. 8 illustrates a schematic cross section through a semiconductor wafer with semiconductor chip structures in semiconductor chip positions on an expandable packaging film.

FIG. 9 illustrates a schematic cross section through the semiconductor wafer in accordance with FIG. 8 after the application of mushroom-shaped connecting elements.

FIG. 10 illustrates a schematic cross section through the semiconductor wafer in accordance with FIG. 9 after the separation of the semiconductor wafer into individual semiconductor chips.

FIG. 11 illustrates a schematic cross section through the separated semiconductor wafer after the expansion of the packaging film.

FIG. 12 illustrates a schematic cross section through a composite body after the embedding of the semiconductor chips into a plastics composition.

FIG. 13 illustrates a schematic cross section through the composite plate in accordance with FIG. 12 after the application of a protective layer to the rear side of the semiconductor chip.

FIG. 14 illustrates a schematic cross section through the composite plate in accordance with FIG. 13 after separation into individual semiconductor components.

FIGS. 15 to 18 illustrate schematic cross sections through components during the production of a semiconductor component in accordance with a third embodiment of the invention.

FIG. 15 illustrates a schematic cross section through a semiconductor wafer with semiconductor chip structures in semiconductor chip positions on a separation film.

FIG. 16 illustrates a schematic cross section through the semiconductor wafer in accordance with FIG. 15 after the application of connecting elements.

FIG. 17 illustrates a schematic cross section through the semiconductor wafer in accordance with FIG. 16 after the application of an insulation layer to the semiconductor wafer.

FIG. 18 illustrates a schematic cross section through the semiconductor wafer in accordance with FIG. 17 after the separation of the semiconductor wafer into individual semiconductor components.

FIG. 19 illustrates a schematic cross section through a semiconductor wafer with semiconductor chip structures in semiconductor chip positions.

FIG. 20 illustrates a schematic cross section through the semiconductor wafer in accordance with FIG. 19 after the application of connecting elements.

FIG. 21 illustrates a schematic cross section through the semiconductor wafer in accordance with FIG. 20 after the application of an insulation layer to the top side of the semiconductor wafer.

FIG. 22 illustrates a schematic cross section through the semiconductor wafer in accordance with FIG. 21 after the separation of the semiconductor wafer into individual semiconductor components.

FIG. 23 illustrates a schematic cross section through the separated semiconductor wafer in accordance with FIG. 22 after the application of an expandable packaging film.

FIG. 24 illustrates a schematic cross section through the semiconductor wafer in accordance with FIG. 23 after the expansion of the packaging film.

DETAILED DESCRIPTION

Figure 25:
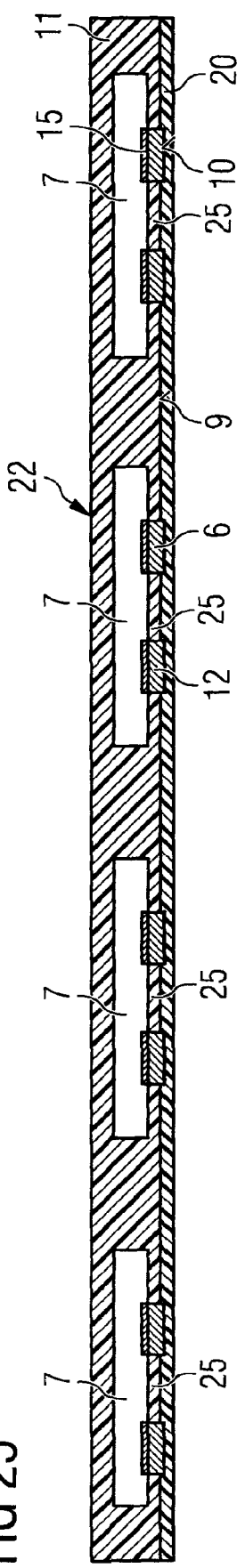
FIG. 25 illustrates a schematic cross section through a composite plate after the embedding of the semiconductor chips on the packaging film into a plastics composition.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor component with connecting elements and a method for producing the same, the semiconductor component having connecting elements on a semiconductor chip made from a semiconductor wafer with discrete semiconductor components for surface mounting on a superordinate circuit carrier. In this case, the intention is to provide connecting elements which can be used for a semiconductor-chip-based housing, the intention being to reduce the method costs in conjunction with reduced dimensions for discrete semiconductor components. In this case, the overall dimensions of the semiconductor component are intended to increase the dimensions of a semiconductor chip for discrete semiconductor components only to an insignificant extent.

The invention provides a semiconductor component with connecting elements between a semiconductor chip made from a semiconductor wafer with discrete semiconductor components and a superordinate circuit carrier, the connecting elements being surface-mountable. For this purpose, the semiconductor component has a coplanar area having top sides of the connecting elements and a plastics composition. The connecting elements have a mesa structure or a mushroom-shaped form for surface mounting and have a structured nickel- and lead-free contact coating. Furthermore, the connecting elements are arranged on contact areas of the semiconductor chips, the areal extent of the connecting elements corresponding to the areal extent of the contact areas of the semiconductor chip. This semiconductor component with discrete semiconductor structures dispenses with connecting elements outside the active top side of the semiconductor chips.

Rather, it limits the areal extent of the connecting elements to the areal extent of the contact areas of the semiconductor chip. This is advantageous in the case of discrete semiconductor components, especially as the number of contact areas per semiconductor chip structure is small. While discrete semiconductor diodes only require access to two electrodes via two contact areas, discrete semiconductor transistors can be equipped with the three electrodes emitter, collector and base. MOS power transistors, too, only require, in principle, connecting elements on three contact areas, namely the contact areas for source, drain and gate.

Since all the contact areas are arranged in surface-mountable fashion on the underside of the semiconductor component and the connecting elements do not exceed the semiconductor chip area, one preferred embodiment of the invention provides for leading rear-side contacts, such as occur in the case of MOS power transistors, via through contacts through the semiconductor chip, from its rear side to its active top side. Such through contacts through a semiconductor chip from the rear side to the active top side can be produced by means of laser ablation or anisotropic plasma etching. However, this necessitates an additional requirement of silicon area in comparison with a bonding wire technique.

A further advantage of this semiconductor component is the structured nickel- and lead-free contact coating on the connecting elements. This ensures that the material of the connecting elements could no longer become embrittled on account of nickel contents. Furthermore, the lead-free nature of the contact coating makes it possible to achieve higher environmental compatibility and to significantly reduce the toxicity of the manufacturing processes. The connecting elements furthermore have the advantage of a flat structure having an areal extent corresponding to the contact areas of the semiconductor chip. The thickness of the connecting elements can be adapted to the demands of the various requirements made of the semiconductor component.

A further advantage is that the connecting elements simultaneously serve as external contacts and so no wiring structures whatsoever are needed for the arrangement and formation of external contact areas and external contacts. This simplifies the manufacture of such semiconductor components according to the invention and yields a cost-effective mass-produced product.

In one embodiment of the invention, the nickel- and lead-free contact coating has a solder mixture containing tin and silver or a solder mixture containing tin and gold. Both solder mixtures are suitable for being used as diffusion solders. The characteristic feature of diffusion solders is that the melting points of the mixture containing tin and silver or tin and gold is lower than the intermetallic phases which form, so that the solder connection finally has a higher melting point than the initial mixture during the diffusion soldering operation. Consequently, the semiconductor component according to the invention can be operated at higher temperatures or it is possible to permit subsequent high-temperature processes without damage to the connecting elements.

In a further embodiment of the invention, the connecting elements may have a UBM layer (under bump metallization) with TiW. Such a UBM layer forms a compensation and a damping for thermomechanical stresses that occur. Such thermomechanical stresses may occur on account of different coefficients of expansion of the semiconductor component material with respect to the material of a superordinate circuit board on which the semiconductor component is to be surface-mounted.

The advantage of these areal connecting elements is that their thickness d can be configured as desired. The thickness d preferably lies between $5\,\mu m \leq d \leq 50\,\mu m$. These thicknesses d can be achieved by applying a correspondingly thick patterned covering layer on the semiconductor wafer on areas that are not to be provided with connecting elements. At the same time, the contact areas are kept free in order to fill them by filling corresponding openings in the covering layer with a nickel- and lead-free contact material. If the original thickness d of the covering layer is exceeded in the course of this filling, then mushroom-shaped connecting elements form, which are advantageous for some special applications.

The connecting elements have electrodeposited metals structured in microcrystalline fashion. For this purpose, the semiconductor wafers with protective covering layer and freely accessible contact areas may be introduced into a corresponding electroplating bath containing metal salts of the metals to be deposited. This method will also be discussed in detail below.

In addition to the discrete semiconductor components, such as semiconductor diodes and semiconductor transistors, already mentioned above, light-emitting diodes and/or radiofrequency transistors may also be provided with such flat connecting elements. Radiofrequency transistors are used in UMTS technology. Such discrete semiconductor components have dimensions in terms of length×width×height (LWH) which are less than or equal to 1.0 mm×0.6 mm×0.4 mm, preferably less than or equal to 0.6 mm×0.3 mm×0.4 mm. On account of these minimal dimensions, thermally induced shear stresses do not have as great an effect as is known in the case of large-area semiconductor components. Accordingly, it is possible to dispense with measures such as an underfill coating for filling an interspace between the semiconductor component and the superordinate circuit board. Rather, it is possible here to use standard plastics compositions which concomitantly fill the interspace automatically during compression moulding.

A method for producing semiconductor components with connecting elements has the following method processes. The first process involves producing semiconductor chip structures for discrete semiconductor components on the top side of a semiconductor wafer in semiconductor component positions, contact areas of the semiconductor component structures being arranged in the semiconductor component positions. In this implementation of the method, a separation film is applied to the rear side of the semiconductor wafer.

Such separation films may serve to fix the semiconductor wafer on a separation table, separation joints being introduced into the semiconductor wafer as far as the separation film in order to separate the semiconductor wafer into individual semiconductor chips without it falling apart. Prior to such a separation process, in this implementation of the method, mesa-type or mushroom-shaped connecting elements are deposited selectively on the contact areas of the semiconductor wafer. The possible deposition methods will be discussed in detail below. After the production of mesa-type or mushroom-shaped connecting elements on the contact areas of the semiconductor wafer, the semiconductor wafer can then be separated into semiconductor chips on the separation film. Before the separation film is actually removed from the rear side of the semiconductor wafer, the top sides of the resultant connecting elements of the separated semiconductor wafer are covered with an adhesively expandable packaging film. Only afterwards is the separation film removed.

The expandable packaging film serves to enlarge the interspaces between the semiconductor chips of the separated semiconductor wafer, by means of the packaging film being expanded, before the semiconductor chips are embedded into a plastic housing composition. In this implementation of the method, the semiconductor chips with their connecting elements of the separated semiconductor wafer on the expanded packaging film are then embedded into a plastics composition. This gives rise to a composite plate with a coplanar area on the packaging film having the top sides of the connecting elements and the plastics composition. Such a composite plate is also called a panel and also arises with higher manufacturing outlay in the case of the WLP method (wafer level packaging) or in the case of the UPP method (universal package process). After the production of such a composite plate, the expanded packaging film is removed. Afterwards, the dimensionally stable, self-supporting composite plate can then be separated into individual semiconductor components.

Cost-effective semiconductor housings can be produced in a manner with this method since all the processes take place at the wafer level or on an expanded film, so that cost-intensive individual processes are avoided. Moreover, a rewiring is completely dispensed with. Instead of a cost-intensive rewiring, the areal extent of the contact areas is configured with a magnitude such that the deposition of the connecting elements gives rise to external contacts which can be directly surface-mounted. Despite this restriction to the external dimensions of a semiconductor chip for fitting external contacts of a semiconductor component, the method makes it possible to produce a semiconductor component embedded into a plastics composition with high reliability since only the surfaces of the connecting elements with the plastics composition form a coplanar area having plastics composition and top sides of the connecting elements or these surfaces can be accessed as external contacts of the semiconductor component.

In addition, it is possible to provide the connecting elements with a nickel-free and lead-free solderable layer, so that solder deposits are also arranged on the connecting elements. Consequently, all the production processes including testing can take place at the wafer level. The semiconductor chip is encapsulated with plastic, in which case, optionally, the rear side may be free of plastics composition or is likewise covered with a plastics composition.

In an alternative method, the semiconductor wafer with its semiconductor chip positions is applied directly by its rear side onto an expandable packaging film. This packaging film serves, instead of the separation film, for supporting a selective deposition of mesa-type or mushroom-shaped connecting elements on the contact areas on the active top side of the semiconductor chip positions. The semiconductor wafer is then separated into semiconductor chips directly on the packaging film. The interspaces between the semiconductor chips can then be enlarged by expansion of the packaging film without conversion from a separation film to a packaging film.

Afterwards, as in the first implementation of the method, the separated semiconductor wafer with connecting elements is embedded into a plastics composition to form a composite plate with formation of a coplanar area having top sides of the connecting elements and the plastics composition. If the expanded packaging film is subsequently removed from the rear sides of the composite plate, the rear sides of the semiconductor chips are uncovered and these can be freely accessed. If this is not desirable, however, then a protective layer may subsequently be applied to the rear side of the composite plate. The composite plate with or without protective layer is then separated into individual semiconductor components. If no protective layer is applied, then semiconductor components are present in the case of which, after the separation of the composite plate, the rear side can be contact-connected or be connected to a heat sink.

The following method processes are provided in a further alternative for an implementation of the method. Firstly, as previously, the semiconductor wafer with its semiconductor chip positions is applied to a separation film and mesa-type or mushroom-shaped connecting elements are deposited selectively on the contact areas of the semiconductor wafer. The top side of the semiconductor wafer is then covered by selective application of an insulating layer whilst leaving free the top sides of the connecting elements. In this case, a coplanar area arises from the top side of the insulation layer and the top sides of the connecting elements, so that a separation process can follow directly in a further implementation of the method according to the invention. The separation process yields semiconductor components which correspond exactly to the semiconductor chips in terms of their areal extent since the edge sides of the semiconductor chips are not protected by a plastics composition.

It is furthermore possible to continue the method in the context of a further method variant to the effect that an expandable packaging film is then applied to the coplanar area of the separated semiconductor wafer and, after the removal of the separation film, the interspace between the semiconductor chips is enlarged by expanding the packaging film in such a way that a plastics composition is deposited on the rear sides and in the interspaces and thus on edge sides of the semiconductor chips. A composite plate is formed as a result, from which the expanded packaging film can subsequently be removed. After the removal of the packaging film, the composite plate will be separated into individual semiconductor components. This method differs from the first and second variants of the method by virtue of the fact that the formation of the coplanar area in the region of the top side of the semiconductor chips arises as a result of a selective application of an insulation layer. The insulation layer may, for its part, in turn have a plastics composition that has proved successful as packaging material for semiconductor components.

These method variants are preferably employed in order to introduce discrete semiconductor component structures for diodes, bipolar transistors or MOS transistors, but in particular for radiofrequency applications, on the top side of the semiconductor wafer in semiconductor chip positions.

A plastically deformable polymer film is applied to the rear side of the semiconductor wafer or to the top sides of the connecting elements of the semiconductor wafer as the expandable packaging film. The film can be heated for expansion. The selective deposition of mesa-type or mushroom-shaped connecting elements and also the deposition of a mixture containing tin and silver or a mixture containing tin and gold on the contact areas may be effected chemically or in electroless fashion or galvanically or electrolytically. The following method processes are carried out for the electrodeposition of the connecting elements on the contact areas of the top side of the semiconductor wafer.

Firstly, by way of example, an electrically conductive submicron thin seed layer is deposited on the top side of the semiconductor wafer with electrical connection of the contact areas. The areas of the top side of the semiconductor wafer that are not to be coated are then provided with a patterned covering layer whilst leaving free the contact areas. Once the semiconductor wafer has been prepared in this form, the electrodeposition of the mesa-type or mushroom-shaped connecting elements on the unprotected contact areas may be effected galvanically by feeding current to the seed layer. As soon as the deposited mesa-type or mushroom-shaped structure of the connecting elements has reached or exceeded the thickness of the covering layer, the electrodeposition of the mesa-type or mushroom-shaped connecting elements is ended and the covering layer and also the seed layer are removed.

In detail, the deposition of an electrically conductive seed layer on the top side of the semiconductor wafer is effected by means of a sputtering technique or by means of a vapour deposition technique. The selective covering of the areas of the top side of the semiconductor wafer that are not to be coated with a covering layer whilst leaving free the contact areas may be effected by means of proven photolithography techniques. Instead of the photolithography techniques, which, for their part, require corresponding sets of masks, the selective covering of the areas of the top side of the semiconductor wafer that are not to be coated whilst leaving free the contact areas may also be effected by means of jet printing.

In the case of jet printing, it is merely necessary to develop a corresponding program in order to correspondingly control and direct the liquid jet including covering material, so that the contact areas remain free for the electrodeposition or chemical deposition. The removal of the covering layer is effected either by means of solvents or by means of plasma incineration. The removal of the seed layer, by contrast, is usually carried out by wet etching of the entire top side of the wafer since the seed layer applied by sputtering or vapour deposition has a thickness in the submicron range and the thickness of the resultant connecting elements is therefore only reduced slightly. The removal of the seed layer may also be effected by means of plasma etching, in which case the wafer surface can be treated extremely mildly on account of the dry etching method. Moreover, there is the possibility of combining the plasma incineration of the covering layer and the plasma etching of the seed layer in an advantageous manner.

As an alternative, it is also possible to obtain the selective deposition of mesa-type or bump-type connecting elements on the contact areas by means of jet printing. In this case, it is not necessary to cover the top side of the semiconductor wafer that is not to be coated. However, this method of jet printing does not yield the high accuracy such as can be achieved by means of corresponding photolithographically patterned covering layers. The separation of the semiconductor wafer into semiconductor chips on a separation film may be effected by means of sawing technology or by means of laser ablation. Both techniques have proved successful, and so they will not be discussed in any greater detail.

The embedding of the separated semiconductor wafer with connecting elements into a plastics composition to form a composite plate with formation of a coplanar area having top sides of the connecting elements and the plastics composition is preferably effected in particular by means of compression moulding. In compression moulding, the plastic is applied to the expanded packaging film whilst encapsulating the semiconductor chips and the packaging film is then introduced into a mould or compression mould, the applied plastic being connected to semiconductor chips to form the composite plate in the compression mould.

As an alternative, it is also possible to thin the semiconductor wafer from the rear side prior to separation into semiconductor chips, or to apply a DBG method (dicing before grinding). Moreover, it is possible to test the function of the semiconductor chips or semiconductor components actually prior to the separation of the semiconductor wafer or prior to the separation of the composite plate.

Consequently, the method according to the invention makes it possible to produce semiconductor components without the latter once again being individually tested or handled after separation. The method according to the invention is thus suitable for inexpensive mass production of functional discrete semiconductor components.

FIG. 1 illustrates a schematic cross section through a semiconductor wafer 8 with semiconductor chip structures in semiconductor chip positions 17 on a separation film 18. For this purpose, the separation film 18 is arranged on the rear side 19 of the semiconductor wafer 8. On the opposite top side 16 of the semiconductor wafer 8, contact areas 15 are arranged in the individual semiconductor component positions 17. Since the method according to the invention was preferably developed for discrete semiconductor components, only two contact areas are arranged on the active top side of the semiconductor wafer 8 in each of the semiconductor component positions 17, especially as a surface-mountable power diode, for example, is involved here. In this case, the large-area contact areas 15 are connected to a corresponding cathode and a corresponding anode of the power diode.

FIG. 2 illustrates a schematic cross section through the semiconductor wafer 8 in accordance with FIG. 1 after the application of mesa-type connecting elements 6. For this purpose, firstly the top side 16 of the semiconductor wafer 8 was coated with an electrically conductive seed layer (not illustrated) having a thickness in the submicron range and the contact areas 15 were thereby short-circuited. A covering layer 26, the contour of which is illustrated by a dashed line 23 in FIG. 2, was subsequently applied on the seed layer whilst leaving free the contact areas 15. The selective application of the covering layer 26 to the regions of the top side 16 of the semiconductor wafer 8 that are not to be coated may be effected by jet printing and/or by means of a photoresist technique.

In the uncovered openings with contact areas 15, a mesa structure 12 can then grow while current is fed to the seed layer, in which case, in this embodiment of the invention, at the end of the deposition, a solder deposit in the form of a solder coating containing a silver/tin mixture or a silver/gold mixture as lead-free and nickel-free contact coating 14 is deposited on the mesa structures 12 of the connecting elements 6. The covering layer 26 can subsequently be removed and the seed layer can finally be etched away. No mask is required for etching the seed layer and for removing the covering layer since it is possible to employ correspondingly selective solvent or incineration methods for the removal of the covering layer 26. For the removal of the seed layer, the entire top side of the semiconductor wafer can be etched, especially as the seed layer in the submicron range only slightly reduces the thickness or height of the mesa-type connecting elements. Once the semiconductor wafer 8 has been prepared in this way, the semiconductor wafer 8 can subsequently be separated into semiconductor chips on the separation film 18.

FIG. 3 illustrates a schematic cross section through the semiconductor wafer 8 in accordance with FIG. 2 after the separation of the semiconductor wafer 8 into individual semiconductor chips 7. This gives rise to an interspace 21 between the semiconductor chips 7 which corresponds to the width of a separation track or a laser ablation track. Since a non-expandable separation film 18 is used in this embodiment of the invention, an expandable packaging film is then applied to the top sides 10 of the connecting elements 6.

FIG. 4 illustrates a schematic cross section through the separated semiconductor wafer 8 in accordance with FIG. 3 after the application of the separated semiconductor wafer 8 to an expandable packaging film 20. The separation film 18, which was still illustrated in FIG. 3, can be removed after the application of the expandable packaging film 20 to the top sides 10 of the connecting elements 6 in mesa structure 12.

FIG. 5 illustrates a schematic cross section through the separated semiconductor wafer 8 in accordance with FIG. 4 after the expansion of the packaging film 20. As a result of the expansion of the packaging film 20 in arrow direction A, the interspace 21 between the semiconductor chips 7 is enlarged in such a way that the semiconductor chips 7 can then be completely packaged into a plastics composition. Compression moulding is preferably used for this purpose, which involves firstly applying the plastics composition to the packaging film 20 and then patterning a composite plate having plastics composition and semiconductor chip in a compression mould, as is known from disc production. In this case, the plastics composition is also distributed in the gap 27 between packaging film 20 and the top sides of the semiconductor chips 7.

FIG. 6 illustrates a schematic cross section through a composite plate 22 after the embedding of the semiconductor chips 7 into a plastics composition 11. After the compression moulding, the composite plate 22 is a self-supporting body with a coplanar area 9 formed on the packaging film 20 and including the top sides 10 of the connecting elements 6 and the top side of the plastic housing composition 11. FIG. 6 furthermore illustrates how the packaging film 20 is then pulled off from the coplanar area 9 in arrow direction B. It is thus possible to test the functionality of the semiconductor components in the composite plate 22 via the now uncovered top sides 10 of the connecting elements 6 before the composite plate is separated into individual semiconductor components.

FIG. 7 illustrates a schematic cross section through the composite plate 22 after separation into individual semiconductor components 1. The dimensional stability of the composite plate 22 is so great that separation into individual semiconductor components 1, as illustrated in FIG. 7, is possible without any problems. The semiconductor components 1 have the size of the semiconductor chips 7 which is slightly enlarged by the surrounding plastics composition. The connecting elements 6 correspond in terms of their areal extent to the contact areas 15 on the top sides of the semiconductor chips 7. The contact layer 14 forms a solder deposit, so that the connecting elements 6 are available as solderable external contacts of the semiconductor components 1.

FIGS. 8 to 14 illustrate schematic cross sections through components during the production of a semiconductor component 2 in accordance with a second embodiment of the invention.

FIG. 8 illustrates a schematic cross section through a semiconductor wafer 8 with a semiconductor chip structure in semiconductor chip positions 17 on an expandable packaging film 20. In contrast to the method for the production of a semiconductor component 1 of a first embodiment of the invention as explained in FIGS. 1 to 7, the semiconductor wafer 8 is now positioned by its rear side 19 directly onto an expandable packaging film 20 and not onto a separation film.

FIG. 9 illustrates a schematic cross section through the semiconductor wafer 8 in accordance with FIG. 8 after the application of connecting elements 6 having a mushroom-shaped form 13. In this case, for the production of the semiconductor component of the second embodiment of the invention, the electrodeposition of the connecting elements 6 was continued until the deposited material grew beyond the covering layer 26 and a mushroom-cap-shaped contour forms on the top side of the covering layer 26, the contour of which is illustrated here by a dashed line 23.

FIG. 10 illustrates a schematic cross section through the semiconductor wafer 8 in accordance with FIG. 9 after the separation of the semiconductor wafer 8 into individual semiconductor chips 7. This separation gives rise to separation joints that create an interspace 21 between the semiconductor chips 7. In this case, care is taken to ensure that the expandable packaging film 20 is not damaged. This second method has the advantage over the first embodiment of the invention that expansion of the packaging film 20 can be carried out directly after the separation of the semiconductor wafer 8 into individual semiconductor chips 7.

FIG. 11 illustrates a schematic cross section through the separated semiconductor wafer 8 after the expansion of the packaging film 20 in the arrow direction A. This gives rise to an extended interspace 21 between the semiconductor chips 7. The advantage of this method over the previous method is that conversion from a separation film to a packaging film 20 is not required. A composite plate is subsequently produced by a compression moulding method.

FIG. 12 illustrates a schematic cross section through a composite plate 22 after the embedding of the semiconductor chips 7 into a plastics composition 11. In this case, the top side of the semiconductor chips 7 between the mushroom-shaped connecting elements 6 is simultaneously covered with plastics composition 11, so that the plastics composition 11 forms a coplanar area 9 with the top sides 10 of the connecting elements 6. In FIG. 12, the packaging film 20 is furthermore pulled off from the in the meantime self-supporting and dimensionally stable composite plate 22, which is also called a "panel" or "wafer level package", in arrow direction B.

As a result, the rear sides 19 of the semiconductor chips 7 are uncovered and are freely accessible if a large-area drain contact of a MOS power transistor is arranged on this rear side 19, by way of example. However, if the free rear side 19 is not required for the semiconductor chips 7, then it may also be protected against mechanical and electrical influences with the aid of a protective layer in the subsequent processes.

FIG. 13 illustrates a schematic cross section through the composite plate 22 in accordance with FIG. 12 after the application of a protective layer 24 to the rear side 19 of the semiconductor chips 7. In this case, the protective layer 24 may also be constructed from a plastic housing composition. In this implementation of the method, the plastics composition is laminated in the form of a film onto the composite body.

FIG. 14 illustrates a schematic cross section through the composite plate 22 after the separation of the composite plate 22 into individual semiconductor components 2. These semiconductor components 2 are also of the order of magnitude of a semiconductor chip 7 and are slightly larger than the semiconductor chip 7 itself by virtue of the surrounding plastics composition and by virtue of the protective layer 24.

FIGS. 15 to 18 illustrate schematic cross sections through components during the production of a semiconductor component 3 of a third embodiment of the invention. The method can be significantly simplified if protection of the edge sides of the semiconductor chips is dispensed with. In this case, a semiconductor component 3 of the third embodiment of the invention may be produced in such a way that its rear sides and edge sides are freely accessible, while a coplanar area 9 including the top sides 10 of the connecting elements and the surface of an insulation layer 25 is produced on the top side of the semiconductor chips 7. For this purpose, firstly, as illustrated in FIG. 15, a semiconductor wafer 8 with semiconductor chip structures in semiconductor chip positions 17 is applied to a separation film 18.

In this respect, FIG. 16 illustrates a schematic cross section through the semiconductor wafer 8 in accordance with FIG. 15 after the application of connecting elements 6 in the individual semiconductor chip positions on the corresponding contact areas 15. In this case, the connecting elements 6 again have a mesa structure 12, their areal extent corresponding to the areal extent of the contact areas 15.

FIG. 17 illustrates a schematic cross section through the semiconductor wafer 8 in accordance with FIG. 16 after the application of an insulation layer 25 to the semiconductor wafer 8. For this purpose, the insulation layer 25 may be applied selectively to the semiconductor wafer 8, so that the top sides 10 of the mesa-type connecting elements 6 remain freely accessible and form a coplanar area 9 with the insulation layer 25.

FIG. 18 illustrates a schematic cross section through the semiconductor wafer 8 in accordance with FIG. 17 after the separation of the semiconductor wafer 8 into individual semiconductor components 3. As already mentioned above, the semiconductor components 3 in accordance with a third embodiment of the invention differ from the previous semiconductor components by virtue of the fact that a protective plastics composition is applied neither on the rear side of the semiconductor chips 7 nor on the edge sides of the semiconductor chips 7. A coplanar area 9 including top sides 10 of the connecting elements 6 with an insulation layer 25 is provided only on the top side of the semiconductor chips 7.

FIGS. 19 to 26 illustrate schematic cross sections through components during the production of a semiconductor component 4 in accordance with a fourth embodiment of the invention.

In this respect, FIG. 19 illustrates a schematic cross section through a semiconductor wafer 8 with semiconductor chip structures in semiconductor chip positions 17, the semiconductor wafer 8 being arranged on a separation film 18 by its rear side 19.

FIG. 20 illustrates a schematic cross section through the semiconductor wafer 8 in accordance with FIG. 19 after the application of connecting elements 6. This may once again be produced by means of the same method processes as in the previous embodiments of the invention. However, it is also possible to apply the connecting elements 6 in the form of contact bumps by jet printing.

FIG. 21 illustrates a schematic cross section through the semiconductor wafer 8 in accordance with FIG. 20 after the application of an insulation layer 25 to the semiconductor wafer 8. The insulation layer 25 is dimensioned such that the top side of the semiconductor wafer 8, apart from the connecting elements 6, is completely covered with plastics composition of the insulation layer 25 and the top sides 10 of the connecting elements 6 form a coplanar area 9 with the insulation layer 25.

FIG. 22 illustrates a schematic cross section through the semiconductor wafer 8 after separation into individual semiconductor chips 7. A packaging film 20 is then applied to the coplanar area 9, as is illustrated in the next figure.

FIG. 23 illustrates a schematic cross section through the separated semiconductor wafer 8 in accordance with FIG. 22 after the application of an expandable packaging film 20. The packaging film 20 is applied to the coplanar area 9 before the separation film 18, which is illustrated in FIG. 22, has actually been removed. The separation film is not removed until after the application of the expandable packaging film 20, as illustrated in FIG. 23. The interspace 21 between the semiconductor chips 7 can then be enlarged.

FIG. 24 illustrates a schematic cross section through the semiconductor wafer 8 in accordance with FIG. 23 after the expansion of the packaging film 20 in arrow direction A. This gives rise to a larger interspace 21 between the semiconductor chips 7, which can be filled with a plastics composition 11 in the next process.

FIG. 25 illustrates a schematic cross section through a composite plate 22 after the embedding of the semiconductor chips 7 into a plastic housing composition 11. With the plastic housing composition 11, the edge sides and the rear sides of the semiconductor chips 7 are then embedded into the plastics composition 11, a composite plate 22 that is dimensionally stable and self-supporting arising at the same time.

Figure 26:
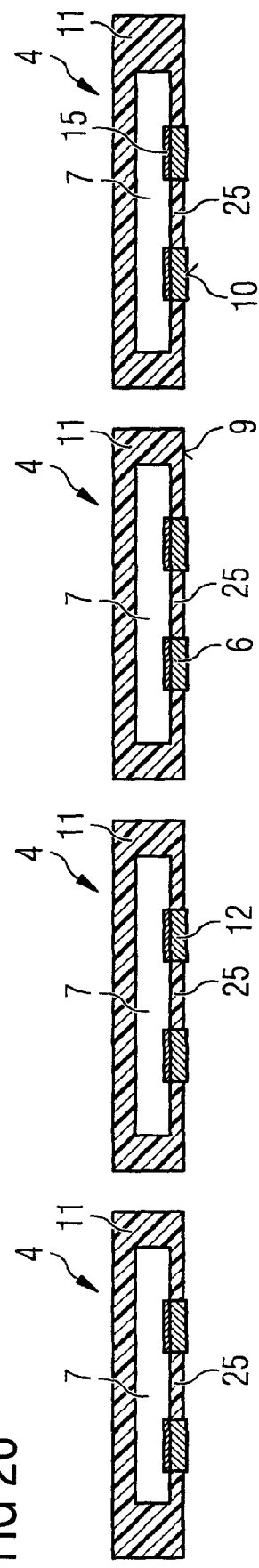
FIG. 26 illustrates a schematic cross section through the composite plate in accordance with FIG. 25 after separation into individual semiconductor components.

FIG. 26 illustrates a schematic cross section through the composite plate 22 in accordance with FIG. 25 after the separation of the composite plate 22 into individual semiconductor components 4. These semiconductor components 4 differ from the other embodiments by virtue of the fact that an insulation layer 25 together with the top sides 10 of the connecting elements 6 has a coplanar area 9 on a plastics composition which covers both the rear side of the semiconductor chips 7 and the edge sides of the semiconductor chips 7.

FIGS. 27 to 31 illustrate schematic cross sections through semiconductor components 1 to 5 of different embodiments of the invention.

Figure 27:
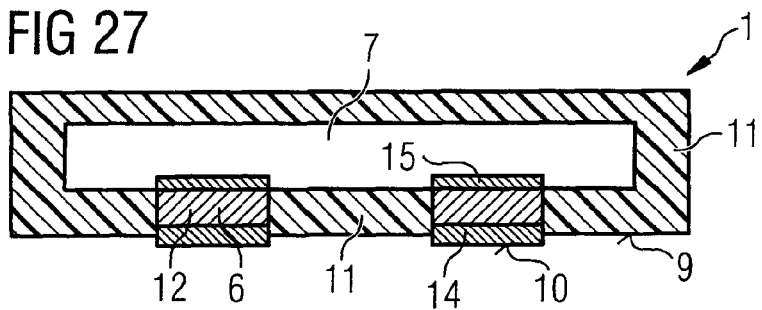
FIG. 27 illustrates a schematic cross section through a semiconductor component in accordance with a first embodiment of the invention.

FIG. 27 illustrates a schematic cross section through a semiconductor component 1 of a first embodiment of the invention. This semiconductor component 1 is embedded uniformly with its connecting elements 6 into a plastic housing composition 11 in such a way that the top sides 10 of the connecting elements 6 of the plastic housing composition 11 form a coplanar area 9.

Figure 28:
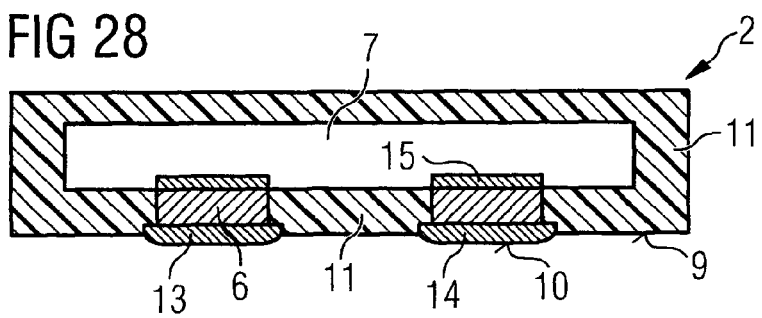
FIG. 28 illustrates a schematic cross section through a semiconductor component in accordance with a second embodiment of the invention.

FIG. 28 illustrates a schematic cross section through a semiconductor component 2 of a second embodiment of the invention. This second embodiment of the invention differs from the first embodiment of the invention by virtue of the fact that the connecting elements 6 have a mushroom-shaped form 13, which may arise during an electrodeposition.

Figure 29:
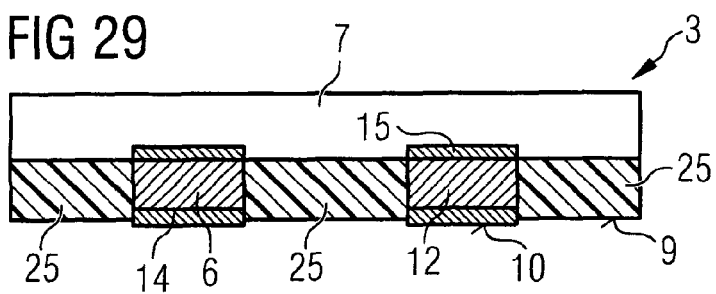
FIG. 29 illustrates a schematic cross section through a semiconductor component in accordance with a third embodiment of the invention.

FIG. 29 illustrates a schematic cross section through a semiconductor component 3 of a third embodiment of the invention. This third embodiment of the invention differs from the first two embodiments of the invention by virtue of the fact that the semiconductor chip 7 has no plastics composition 11 on its rear side and its edge sides and only the connecting elements 6 are surrounded by an insulation layer 25 forming a coplanar area 9 with the top sides 10 of the connecting elements 6.

Figure 30:
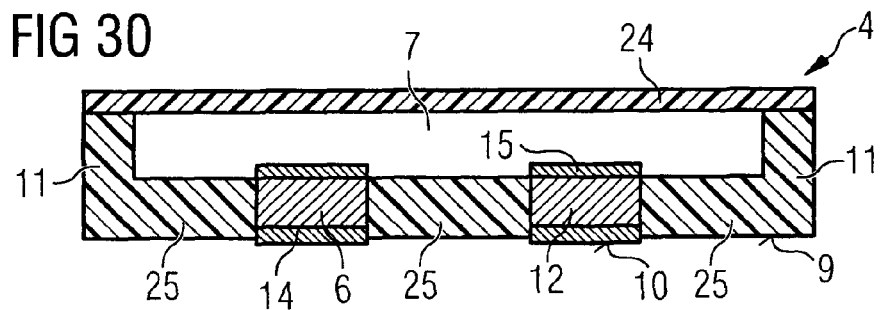
FIG. 30 illustrates a schematic cross section through a semiconductor component in accordance with a fourth embodiment of the invention.

FIG. 30 illustrates a schematic cross section through a semiconductor component 4 of a fourth embodiment of the invention. In this embodiment of the invention, the plastics composition 11 may comprise three different materials. While the edge sides are surrounded by a standard plastics composition 11, the connecting elements 6 are surrounded by an insulation layer 25. The rear side of the semiconductor chips 7 is covered by a protective layer 24. In principle, these three housing-forming plastic materials may be produced from a uniform plastics composition, but in this embodiment of the invention in accordance with FIG. 30 the individual layers differ by virtue of their filler content.

Figure 31:
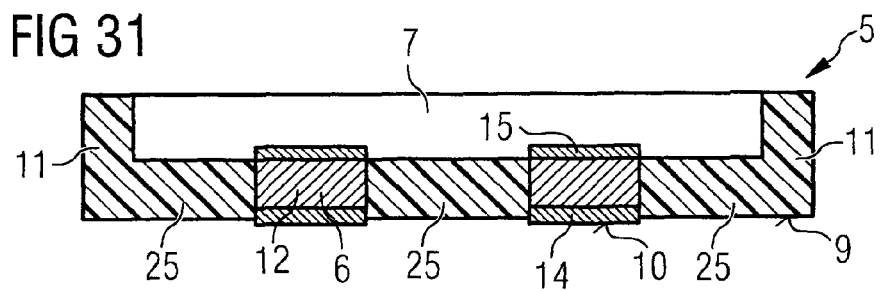
FIG. 31 illustrates a schematic cross section through a semiconductor component in accordance with a fifth embodiment of the invention.

FIG. 31 illustrates a schematic cross section through a semiconductor component 5 in accordance with a fifth embodiment of the invention, this embodiment of the invention differing by virtue of the fact that the rear side of the semiconductor chip 7 is accessible externally, while the edge sides of the semiconductor chip 7 are protected by a plastic housing composition 11. In this case, too, the plastic housing may be constructed from two different materials by virtue of the edge sides being surrounded by a standard plastics composition 11 and the top side of the semiconductor chip 7 being covered by an insulation layer 25.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method for producing semiconductor components with connecting elements, the method comprising:
   producing semiconductor chip structures for discrete semiconductor components on the top side of a semiconductor wafer in semiconductor chip positions, which have contact areas;
   applying a separation film to the rear side of the semiconductor wafer;
   selective depositing mesa-type or mushroom-shaped connecting elements on the contact areas;
   selective applying an insulation layer to the top side of the semiconductor wafer whilst leaving free the top sides of the connecting elements;
   separating the semiconductor wafer into semiconductor chips on the separation film;
   applying an adhesive expandable packaging film to the insulation layer and the uncovered top sides of the connecting elements of the top side of the semiconductor wafer;
   removing the separation film from the rear side of the semiconductor wafer;
   expanding the packaging film with enlargement of the interspaces between the semiconductor chips;
   embedding the separated semiconductor wafer with connecting elements on the expanded packaging film into a plastics composition to form a composite plate with a coplanar area on the packaging film comprising top sides of the connecting elements and the plastic housing composition;
   removing the expanded packaging film;
   separating the composite plate into individual semiconductor components.

2. The method according to claim 1, comprising wherein as semiconductor chip structures, discrete semiconductor component structures for diodes, bipolar transistors or MOS transistors in particular for radiofrequency applications are introduced on the top side of the semiconductor wafer in semiconductor chip positions.

3. The method according to claim 1, comprising applying a plastically deformable polymer film is applied to the rear side of the semiconductor wafer as the expandable packaging film.

4. The method according to claim 1, comprising depositing a mixture comprising tin and silver or a mixture comprising tin and gold is deposited chemically during the selective deposition of the mesa-type or mushroom-shaped connecting elements.

5. The method according to claim 1, comprising selective depositing of the connecting elements on the contact areas is effected by means of electrodeposition of metal.

6. The method according to claim 5, comprising carrying out the following method processes out for the electrodeposition of the connecting elements on the contact areas of the top side of the semiconductor wafer:
   depositing an electrically conductive seed layer on the top side of the semiconductor wafer with electrical connection of the contact areas;
   covering the areas of the top side of the semiconductor wafer that are not to be coated with a patterned covering layer whilst leaving free the contact areas;
   electrodepositing the mesa-type or mushroom-shaped connecting elements on the unprotected contact areas whilst feeding current to the seed layer;
   removing of the covering layer and the seed layer.

7. The method according to claim 6, comprising depositing an electrically conductive seed layer on the top side of the semiconductor wafer by means of sputtering technology.

8. The method according to claim 6, comprising depositing an electrically conductive seed layer on the top side of the semiconductor wafer by means of vapour deposition technology.

9. The method according to claim 1, comprising selective covering the areas of the top side of the semiconductor wafer that are not to be coated with a covering layer whilst leaving free the contact areas by means of photolithography.

10. The method according to claim 1, comprising selective covering of the areas of the top side of the semiconductor wafer that are not to be coated whilst leaving free the contact areas by jet printing.

11. The method according to claim 1, comprising removing the covering layer using solvents.

12. The method according to claim 1, comprising removing the covering layer using plasma incineration.

13. The method according to claim 1, comprising removing the seed layer using wet etching.

14. The method according to claim 1, comprising removing the seed layer using plasma etching.

15. The method according to claim 1, comprising selective depositing mesa-type or bump-type connecting elements on the contact areas by jet printing.

16. The method according to claim 1, comprising separating the semiconductor wafer into semiconductor chips on a separation film by sawing technology.

17. The method according to claim 1, comprising expanding the packaging film arranged on the rear sides or the top sides of the connecting elements of the semiconductor chips for the purpose of enlarging the interspaces between the semiconductor chips with heating of the packaging film.

18. The method according to claim 1, comprising embedding the separated semiconductor wafer with connecting elements into a plastics composition to form a composite plate with formation of a coplanar area comprising top sides of the connecting elements and the plastic housing composition by injection-moulding technology.

19. The method according to claim 1, comprising separating the composite plate into individual semiconductor components by laser ablation.

20. The method according to claim 1, comprising thinning the semiconductor wafer from the rear side prior to separation into semiconductor chips.

21. The method according to claim 1, comprising testing the function of the semiconductor chips in the semiconductor chip positions prior to the separation of the semiconductor wafer into semiconductor chips.

22. The method according to claim 1, comprising testing the function of the semiconductor components on the composite plate prior to the separation of the composite plate into individual semiconductor components.

* * * * *